United States Patent
Ashida

(10) Patent No.: US 9,841,681 B2
(45) Date of Patent: Dec. 12, 2017

(54) LIGHT IRRADIATION APPARATUS, DRAWING APPARATUS, AND PHASE DIFFERENCE GENERATOR

(71) Applicant: SCREEN Holdings Co., Ltd., Kyoto (JP)

(72) Inventor: Yuki Ashida, Kyoto (JP)

(73) Assignee: SCREEN HOLDINGS CO., LTD., Tokyo (JP)

( * ) Notice: Subject to any disclaimer, the term of this patent is extended or adjusted under 35 U.S.C. 154(b) by 131 days.

(21) Appl. No.: 14/820,228

(22) Filed: Aug. 6, 2015

(65) Prior Publication Data
US 2016/0041476 A1    Feb. 11, 2016

(30) Foreign Application Priority Data
Aug. 7, 2014 (JP) ................. 2014-161185

(51) Int. Cl.
*G03F 7/20* (2006.01)
*G02B 3/00* (2006.01)
*G02B 27/12* (2006.01)
*G02B 27/09* (2006.01)

(52) U.S. Cl.
CPC ....... *G03F 7/70191* (2013.01); *G02B 3/0037* (2013.01); *G02B 27/0905* (2013.01); *G02B 27/0961* (2013.01); *G02B 27/123* (2013.01); *G02B 2207/117* (2013.01)

(58) Field of Classification Search
CPC .......... G02B 2207/117; G02B 27/0905; G02B 27/0961; G02B 27/123; G02B 3/0037; G03F 7/70191
See application file for complete search history.

(56) References Cited

U.S. PATENT DOCUMENTS 5,642,183 A * 6/1997 Sugihara ............. G03F 7/70091
355/53

FOREIGN PATENT DOCUMENTS

| JP | 2002-321081 A | 11/2002 |
| JP | 2009-94329 A | 4/2009 |

* cited by examiner

*Primary Examiner* — Michelle M Iacoletti
(74) *Attorney, Agent, or Firm* — McDermott Will & Emery LLP

(57) ABSTRACT

Laser light from a light source part is guided to an irradiation plane by an irradiation optical system. In the irradiation optical system, element lenses are arrayed, and light fluxes that have passed through the element lenses respectively enter transparent elements. Irradiation regions of the light from the element lenses are superimposed on the irradiation plane. When each pair of adjacent target element lenses out of three target element lenses arrayed sequentially is regarded as a target element lens pair, the optical path lengths of three transparent elements corresponding to the three target element lenses are determined such that a peak position of light intensity on the irradiation plane resulting from the interference between the light fluxes through one target element lens pair is different from that corresponding to the other pair. This suppresses variations in light intensity caused by interference between the light fluxes on the irradiation plane.

11 Claims, 7 Drawing Sheets

LIGHT IRRADIATION APPARATUS, DRAWING APPARATUS, AND PHASE DIFFERENCE GENERATOR

TECHNICAL FIELD

The present invention relates to a light irradiation apparatus, a drawing apparatus, and a phase difference generator.

BACKGROUND ART

There are conventionally known light irradiation apparatuses in which laser light incident from a light source part is divided into a plurality of light fluxes by a plurality of cylindrical lenses in a cylindrical lens array, and irradiation regions of the light fluxes are superimposed on one another on an irradiation plane by another lens. With such light irradiation apparatuses, interference fringes (speckle patterns) appear on the irradiation plane due to interference between the light fluxes. In the case of using a bar laser having a plurality of light emitting points (emitters) in the light source part, the coherence is not high among the plurality of light emitting points. However, the same interference-fringe problem occurs because laser light emitted from a single light emitting point is divided into a plurality of light fluxes and the light fluxes are superimposed on one another.

Thus, techniques that provide an optical path length difference generation part in the vicinity of the cylindrical lens array have been proposed (see, for example, Japanese Patent Application Laid-Open Nos. 2002-321081 and 2009-94329). The optical path length difference generation part includes a plurality of transparent parts that produce a difference in optical path length between them, the difference being longer than the coherence length (coherence distance) of the laser light, and light fluxes that have passed through the transparent parts or light fluxes that travel toward the transparent parts respectively enters the cylindrical lenses. This suppresses variations in light intensity due to interference between the light fluxes on the irradiation plane.

The provision of the above optical path length difference generation part, however, increases the size of the light irradiation apparatus because the plurality of transparent parts need to produce a difference in optical path length longer than the coherence length of the laser light, thus increasing the lengths of the transparent parts. There is thus demand for techniques that suppress variations in light intensity due to interference between the light fluxes on the irradiation plane while suppressing an increase in the size of the light irradiation apparatus.

SUMMARY OF INVENTION

The present invention is intended for a light irradiation apparatus, and it is an object of the present invention to suppress variations in light intensity due to interference between light fluxes on the irradiation plane while suppressing an increase in the size of the light irradiation apparatus.

The light irradiation apparatus according to the present invention includes a light source part for emitting laser light toward a predetermined position, and an irradiation optical system disposed at the predetermined position and for guiding the laser light emitted from the light source part to an irradiation plane along an optical axis. The irradiation optical system includes a division lens part including a plurality of element lenses arrayed in an array direction perpendicular to the optical axis, and for dividing incident light by the plurality of element lenses, a phase difference generation part including a plurality of transparent elements arrayed in the array direction and in which light fluxes that have passed through the plurality of element lenses or light fluxes that travel toward the plurality of element lenses respectively enters the plurality of transparent elements, and a light condensing part disposed closer to the irradiation plane than the division lens part and the phase difference generation part are, and for superimposing irradiation regions of light fluxes from the plurality of element lenses on each other on the irradiation plane. When each pair of adjacent target element lenses out of three target element lenses that are arrayed sequentially in the array direction among the plurality of element lenses is regarded as a target element lens pair, optical path lengths of three transparent elements that correspond respectively to the three target element lenses are determined such that a peak position of light intensity on the irradiation plane resulting from interference between light fluxes that have passed through one target element lens pair is different from a peak position of light intensity on the irradiation plane resulting from interference between light fluxes that have passed through the other target element lens pair. A difference in optical path length between two transparent elements that correspond to each target element lens pair is less than a coherence length of the laser light.

According to the present invention, it is possible to suppress variations in light intensity due to interference between the light fluxes on the irradiation plane while suppressing an increase in the size of the light irradiation apparatus.

In a preferred embodiment of the present invention, each of a plurality of combinations of three element lenses that are arrayed sequentially in the array direction among the plurality of element lenses is the three target element lenses. This can further suppress variations in light intensity on the irradiation plane.

In another preferred embodiment of the present invention, the division lens part and the phase difference generation part are adjacent to each other. This allows the light flux that has passed through each element lens to easily enter the corresponding transparent element, or allows the light flux that has passed through each transparent element to easily enter the corresponding element lens.

In a more preferred light irradiation apparatus, a difference in optical path length between the two transparent elements is less than or equal to a wavelength of the laser light. This can further suppress an increase in the size of the light irradiation apparatus.

In one aspect of the present invention, the light source part emits linear light toward the predetermined position, and a direction of incidence of the linear light is perpendicular to the array direction of the plurality of element lenses of the division lens part.

The present invention is also intended for a drawing apparatus. The drawing apparatus according to the present invention includes the above-described light irradiation apparatus, a spatial light modulator disposed on the irradiation plane in the light irradiation apparatus, a projection optical system for guiding spatially modulated light emitted from the spatial light modulator onto an object, a movement mechanism for moving an irradiation position to be irradiated with the spatially modulated light on the object, and a control part for controlling the spatial light modulator in synchronization with the movement of the irradiation position by the movement mechanism.

The present invention is also intended for a phase difference generator provided in an irradiation optical system of a light irradiation apparatus that includes a light source part for emitting laser light toward a predetermined position and the irradiation optical system disposed at the predetermined position and for guiding the laser light emitted from the light source part to an irradiation plane along an optical axis.

These and other objects, features, aspects and advantages of the present invention will become more apparent from the following detailed description of the present invention when taken in conjunction with the accompanying drawings.

DESCRIPTION OF EMBODIMENTS

Figure 1:
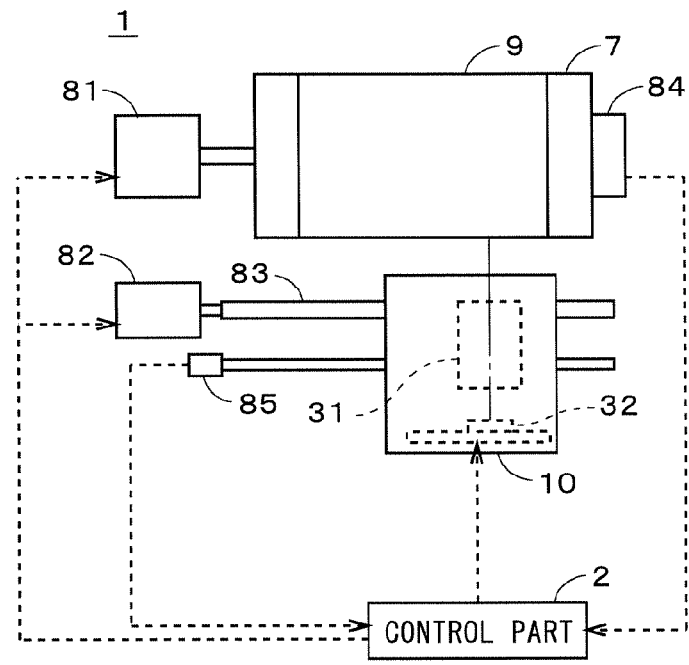
FIG. 1 illustrates a configuration of a drawing apparatus.

FIG. 1 illustrates a configuration of a drawing apparatus 1 according to an embodiment of the present invention. The drawing apparatus 1 is an apparatus for recording an image on a recording medium 9 by irradiation with light, and includes an optical head 10 for emitting light for image recording, and a holding drum 7 for holding the recording medium 9 on which an image is recorded by exposure. The recording medium 9 is, for example, a printing plate or a film for forming a printing plate. Note that the holding drum 7 may also be a photoconductor drum for plateless printing, in which case the recording medium 9 can be regarded as corresponding to the surface of the photoconductor drum, and the holding drum 7 can be regarded as integrally holding the recording medium 9.

The holding drum 7 is rotated by a motor 81 about the central axis of a cylindrical surface on which the recording medium 9 is held, and the optical head 10 can be moved in parallel with the rotation axis of the holding drum 7 by a motor 82 and a ball screw 83. The rotation angle of the holding drum 7 and the position of the optical head 10 are detected by encoders 84 and 85.

Figure 2:
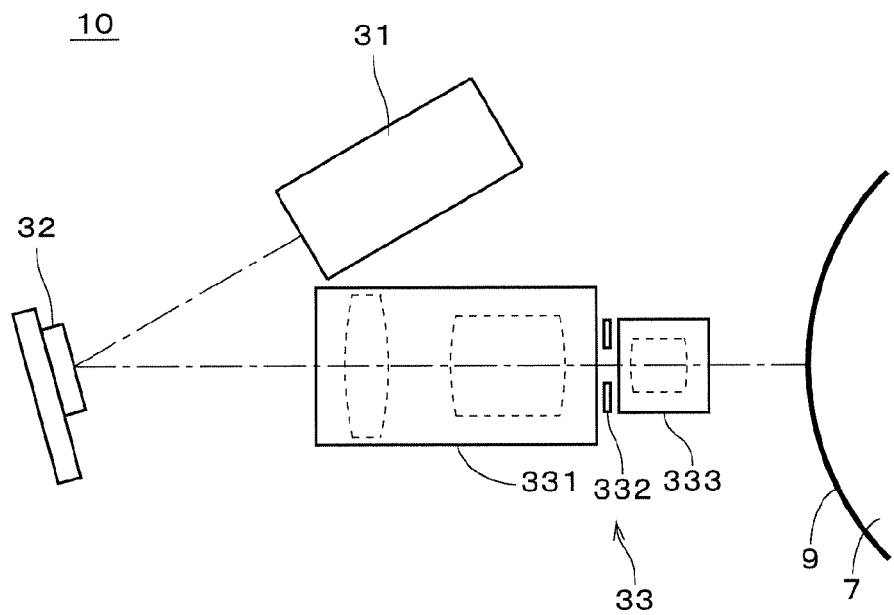
FIG. 2 illustrates a configuration of an optical head.

FIG. 2 illustrates an internal configuration of the optical head 10 when viewed in a direction along the rotation axis of the holding drum 7 and the axis of movement of the optical head 10 (the axis of the ball screw 83). The optical head 10 includes a light irradiation apparatus 31, a spatial light modulator 32, and a projection optical system 33. The light irradiation apparatus 31 irradiates the spatial light modulator 32 with linear light. The details of the light irradiation apparatus 31 will be described later. The spatial light modulator 32 is of, for example, a diffraction grating type as well as a reflection type, and is a diffraction grating whose grating depth can be changed. The spatial light modulator 32 is manufactured using semiconductor device manufacturing technologies. The diffraction grating type light modulator used in the present embodiment is, for example, GLV (Grating Light Valve), which is a registered trademark of Silicon Light Machines, Sunnyvale, Calif. The spatial light modulator 32 includes a plurality of grating elements arrayed in a row, and each grating element transitions between a state in which first-order diffraction light is emitted and a state in which zero-order diffraction light (zero-order light) is emitted. Thus, spatially modulated light is emitted from the spatial light modulator 32.

The projection optical system 33 has a double telecentric optical system that includes an aperture 332, a first optical system 331 disposed between the spatial light modulator 32 and the aperture 332, and a second optical system 333 disposed between the aperture 332 and the holding drum 7. The first optical system 331 guides the light received from the spatial light modulator 32 to the aperture 332. The aperture 332 blocks off the plus and minus first-order diffraction light (and high-order diffraction light) from the spatial light modulator 32 and passes the zero-order diffraction light. The light that has passed through the aperture 332 is guided to the recording medium 9 by the second optical system 333 so that the image of the spatial light modulator 32 is projected onto the recording medium 9. In this way, the projection optical system 33 guides the spatially modulated light emitted from the spatial light modulator 32 onto the recording medium 9.

A control part 2 in FIG. 1 is connected to and controls the light irradiation apparatus 31, the spatial light modulator 32, the encoders 84 and 85, and the motors 81 and 82. In the drawing apparatus 1, the rotation of the holding drum 7 and the movement of the optical head 10 move an irradiation position that is to be irradiated with the light from the spatial light modulator 32 on the recording medium 9. In other words, the motors 81 and 82 serve as a movement mechanism for moving the irradiation position on the recording medium 9. The control part 2 also controls the spatial light modulator 32 in synchronization with the movement of the irradiation position. Accordingly, an image is recorded (i.e., drawn) on the recording medium 9.

Figure 3:
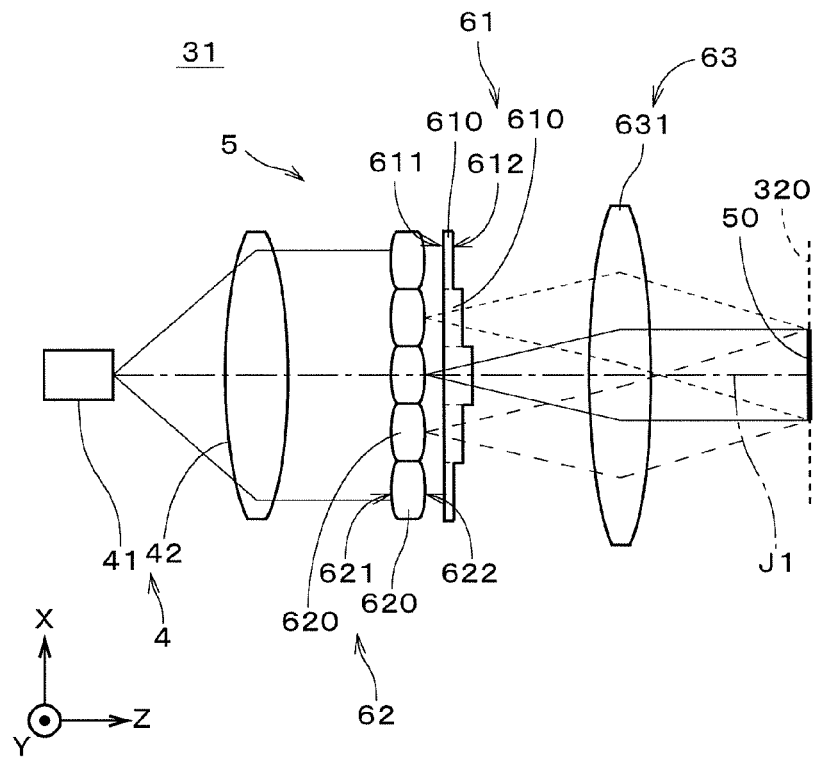
FIG. 3 illustrates a configuration of a light irradiation apparatus.

FIG. 3 illustrates a configuration of the light irradiation apparatus 31. In FIG. 3, a direction parallel to an optical axis J1 of an irradiation optical system 5, which will be described later, is shown as a Z direction, and directions perpendicular to the Z direction and orthogonal to each other are shown as X and Y directions (the same applies below). FIG. 3 illustrates the configuration of the light irradiation apparatus 31 when viewed in (along) the Y direction.

The light irradiation apparatus 31 includes a light source part 4 and the irradiation optical system 5. The light source part 4 includes a light source 41 and a collimating lens 42. The light source 41 is a so-called bar-type semiconductor laser (bar laser) and has a plurality of light emitting points arrayed in a row in the X direction. Light emitted from each light emitting point is collimated by the collimating lens 42 and enters the irradiation optical system 5 as parallel light. When viewed as a whole, the light source part 4 emits linear light toward the irradiation optical system 5 where the light flux cross-section perpendicular to the optical axis J1 is long in the X direction.

The irradiation optical system 5 is disposed at the irradiation position that is to be irradiated with the laser light (linear light) emitted from the light source part 4. The irradiation optical system 5 guides the laser light along the optical axis J1 to the surface of the spatial light modulator 32 that is an irradiation plane (indicated by a broken line 320 in FIG. 3), i.e., the surfaces of the plurality of grating elements. The irradiation optical system 5 includes a phase difference generation part 61, a division lens part 62, and a light condensing part 63. In the irradiation optical system 5, the division lens part 62, the phase difference generation part 61, and the light condensing part 63 are arranged in this order along the optical axis J1 from the light source part 4 toward the irradiation plane 320. The collimated laser light from the light source part 4 enters the division lens part 62.

The division lens part 62 includes a plurality of lenses 620 (hereinafter, referred to as "element lenses 620") that are densely arrayed with a fixed pitch in a direction (here, the X direction) that is perpendicular to the optical axis J1 of the irradiation optical system 5 and along the array of the light emitting points of the light source part 4. The direction of incidence of the laser light from the light source part 4 is perpendicular to the array direction of the element lenses 620, and the laser light enters the division lens part 62 along the optical axis J1. Each element lens 620 is in the shape of a block that is long in the Y direction, and has a first lens surface 621 that is a side surface on the −Z side (on the light source part 4 side) and a second lens surface 622 that is a side surface on the +Z side (on the phase difference generation part 61 side). When viewed in the Y direction, the first lens surface 621 is a convex surface protruding on the −Z side, and the second lens surface 622 is a convex surface protruding on the +Z side. When viewed in the X direction, each element lens 620 has a rectangular shape. In this way, the element lenses 620 are cylindrical lenses that have power in only the X direction, and the division lens part 62 is a so-called cylindrical lens array (or a cylindrical fly-eye lens).

The first lens surface 621 and the second lens surface 622 have a symmetrical shape relative to a plane perpendicular to the optical axis J1 (i.e., a plane parallel to an XY plane). The first lens surface 621 is arranged at the focal point of the second lens surface 622, and the second lens surface 622 is arranged at the focal point of the first lens surface 621. In other words, the first lens surface 621 and the second lens surface 622 have the same focal length. The parallel light incident on the element lenses 620 converges on the second lens surface 622. The plurality of element lenses 620 stacked in the X direction may be formed as an integral member, or may be separately formed and bonded together.

When viewed in the Y direction as illustrated in FIG. 3, the light incident on the division lens part 62 is divided in the X direction (the array direction of the element lenses 620) by the plurality of element lenses 620. At this time, the parallel light emitted from each light emitting point of the light source part 4 enters the first lens surface 621 of each element lens 620, so that images of a plurality of (new (secondary)) light emitting points different from the light source part 4 are formed in the vicinity of the second lens surface 622. The light divided by the element lenses 620 (into a plurality of light fluxes) is emitted from the second lens surfaces 622 such that the principal rays are parallel to the optical axis J1 (Z direction). The light flux emitted from each element lens 620 enters the phase difference generation part 61 while spreading out.

The phase difference generation part 61 includes a plurality of transparent elements 610 that are densely arrayed with a fixed pitch in a direction (here, the X direction) that is perpendicular to the optical axis J1 and along the array of the light emitting points of the light source part 4. In the example in FIG. 3, the number of transparent elements 610 in the phase difference generation part 61 is the same as the number of element lenses 620 in the division lens part 62. The array pitch of the transparent elements 610 is equal to that of the element lenses 620. The plurality of transparent elements 610 arrayed in a row in the X direction have the same X-direction length and the same Y-direction length, and adjacent transparent elements 610 have different thicknesses (lengths) in the Z direction, i.e., in the direction along the optical axis J1. Thus, the transparent elements 610 that are adjacent to each other have different optical path lengths. As will be described later, the phase difference generation part 61 is a phase difference generator that produces a phase difference in the light passing through the plurality of element lenses 620.

Among the plurality of transparent elements 610 in the phase difference generation part 61 in FIG. 3, the transparent element 610 that is located in the center in the X direction has a maximum thickness in the Z direction, and the transparent elements 610 decrease in thickness toward both ends in the X direction. The thicknesses of the plurality of transparent elements 610 in the direction of the optical axis J1 do not necessarily have to increase (or decrease) sequentially in the X direction, and may form an arbitrary irregular shape. In the present embodiment, the plurality of transparent elements 610 of the phase difference generation part 61 are made of the same material and formed as an integral member. The functions of the phase difference generation part 61 will be described later.

The division lens part 62 and the phase difference generation part 61 are disposed close to each other in the Z direction, and the plurality of element lenses 620 and the plurality of transparent elements 610 are respectively arrayed at the same positions in the X direction. Thus, a plurality of light fluxes that have passed through the plurality of (all) element lenses 620 respectively enter the plurality of transparent elements 610. To be more specific, a light flux emitted from the second lens surface 622 of each element lens 620 enters an entrance surface 611 that is the −Z side surface of the transparent element 610 that is disposed at the same position in the X direction as that element lens 620. This light flux passes through the transparent element 610 and is emitted from an exit surface 612 that is the +Z side surface of the transparent element 610. FIG. 3 illustrates only the paths of light passing through some of the transparent elements 610.

In actuality, the width in the X direction of the light flux emitted from the exit surface 612 of each transparent element 610 is smaller than the width of the transparent element 610, i.e., the array pitch of the transparent elements 610. This prevents or suppresses the light flux from falling on the edges of the transparent element 610 (i.e., the edges in the X direction; principally, the edges of the entrance surface 611 and the exit surface 612).

The light flux that has passed through each transparent element 610 travels toward the light condensing part 63. The light condensing part 63 includes a condensing lens 631. The condensing lens 631 is disposed at, for example, a position spaced on the +Z side by its focal length from the second lens surfaces 622 of the plurality of element lenses 620. In other words, the second lens surface 622 of each element lens 620 is disposed at a front focal position of the condensing lens 631. The irradiation plane 320 on the optical axis J1 is disposed at a position spaced on the +Z side by the focal length of the condensing lens 631 from the condensing lens 631. In other words, the irradiation plane 320 is disposed at a back focal position of the condensing lens 631.

When viewed in the Y direction, the plurality of light fluxes emitted from the plurality of element lenses 620 are collimated by the condensing lens 631 and superimposed on one another on the irradiation plane 320. In other words, irradiation regions 50 of the light emitted from the plurality of element lenses 620 (i.e., the plurality of light fluxes that have passed through the plurality of transparent parts 610) wholly overlap. The irradiation regions 50 are indicated by a bold solid line in FIG. 3 and have a fixed width in the X direction.

When viewed in the X direction, the light incident on the division lens part 62 from the light source part 4 passes as parallel light along the optical axis J1 (to be precise, parallel light that is parallel to a ZX plane) through the division lens part 62 and the phase difference generation part 61 and is guided to the condensing lens 631. The condensing lens 631 causes this parallel light to converge on the irradiation plane 320. Thus, the irradiation region 50 of the light emitted from each element lens 620 forms a line that extends in the X direction on the irradiation plane 320. This produces linear illumination light that is a collection of the light fluxes that have passed through the plurality of element lenses 620 and whose cross-section on the irradiation plane 320 (i.e., a light flux cross-section perpendicular to the optical axis J1) forms a line that extends in the X direction.

Figure 4:
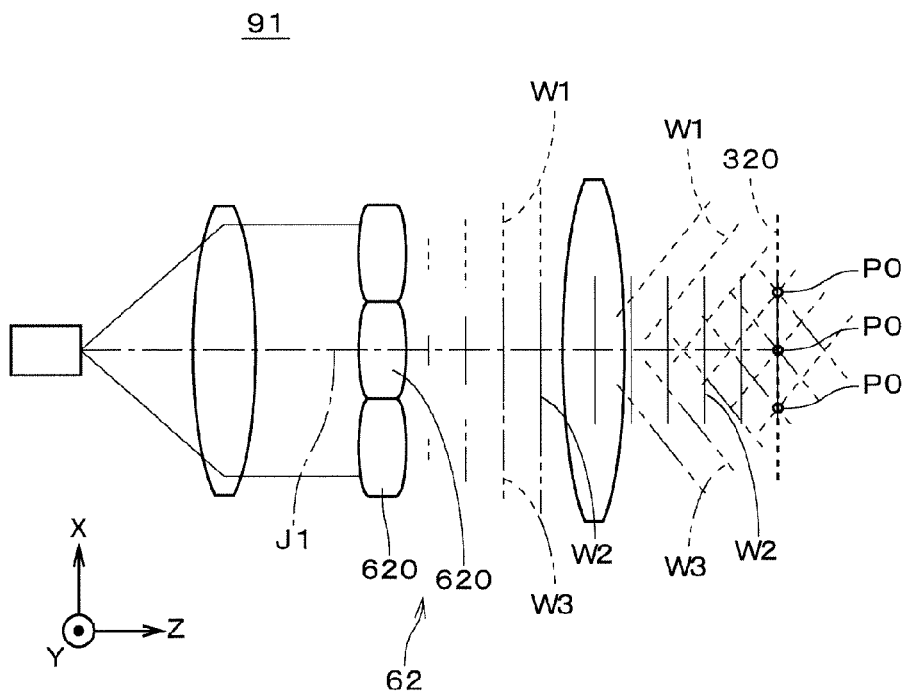
FIG. 4 illustrates a light irradiation apparatus according to a comparative example.

FIG. 4 illustrates a light irradiation apparatus 91 according to a comparative example. The light irradiation apparatus 91 of the comparative example in FIG. 4 includes three element lenses 620 and omits the phase difference generation part 61. The other constituent elements of the light irradiation apparatus 91 of the comparative example are the same as those of the light irradiation apparatus 31 in FIG. 3. In the following description, the three element lenses 620 are given numbers in ascending order from the +X side toward the −X direction (the same applies to three element lenses 620 and three transparent elements 610 in FIG. 6, which will be described later). In FIG. 4, the positions of wavefronts having the same phase in the light fluxes that have passed through the first to third element lenses 620 are respectively indicated by a broken line W1, a solid line W2, and a dashed double-dotted line W3 (the same applies to FIG. 6).

Figure 5:
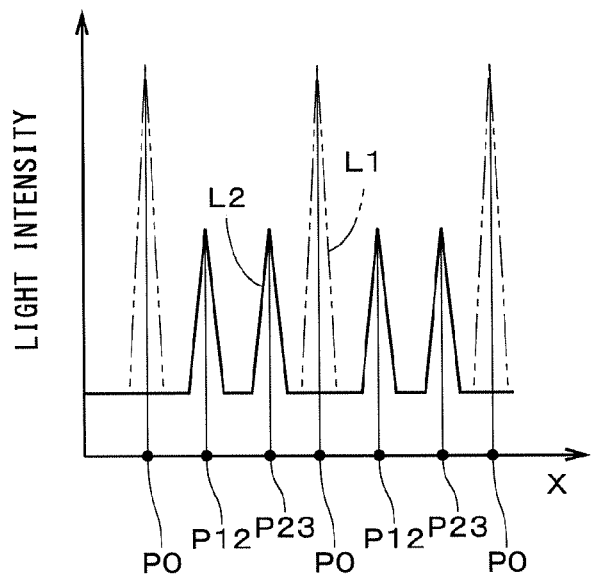
FIG. 5 illustrates a distribution of light intensities.

With the light irradiation apparatus 91 of the comparative example, interference between the light that has passed through the first element lens 620 and the light that has passed through the second element lens 620 produces bright interference fringes (speckle patterns), i.e., peaks in light intensity, at a plurality of positions indicated by P0 on the irradiation plane 320. Also, interference between the light that has passed through the second element lens 620 and the light that has passed through the third element lens 620 produces peaks in light intensity at the same positions P0 on the irradiation plane 320 where the aforementioned peaks are produced. Accordingly, large peaks periodically appear in the X direction as indicated by a dashed double-dotted line L1 in FIG. 5 in the distribution of light intensities on the irradiation plane 320. In actuality, a minimum value at positions corresponding to valleys in the distribution of light intensities decreases following the production of large peaks in light intensity.

When a difference between the maximum and minimum values of light intensity increases in this way, problems arise such as degradation in drawing quality due to the drawing apparatus being unable to perform precise calibration (image correction). The calibration operation involves adjusting driving voltages for all grating elements in the spatial light modulator 32 in accordance with a specific value in the distribution of light intensities. Thus, a large variation (difference between the maximum and minimum values) in light intensity may produce a large number of portions that are drawn at light intensities different from the specific value used in adjustment and accordingly reduce the quality of the drawing. Note that it is also conceivable to use a diffuser panel to suppress the appearance of interference fringes, but in this case, light will also spread in the Y direction and linear illumination light that extends in the X direction cannot be obtained.

Figure 6:
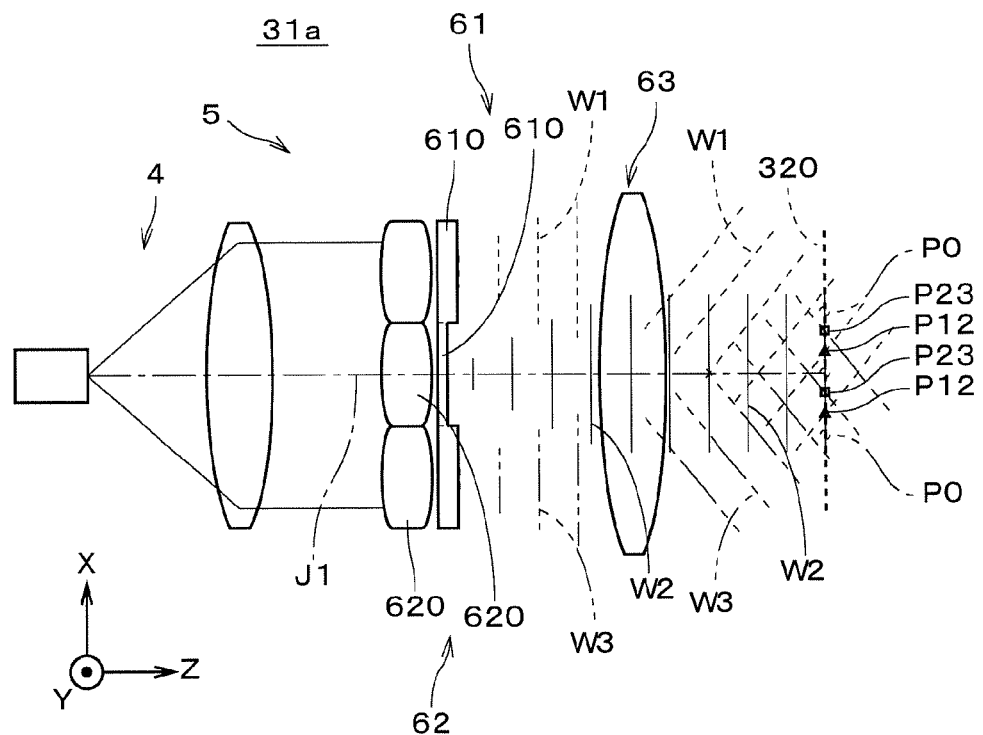
FIG. 6 is a diagram for describing functions of a phase difference generation part.

FIG. 6 is a diagram for describing the functions of the phase difference generation part and illustrates a light irradiation apparatus 31*a* that is configured by adding the phase difference generation part 61 to the light irradiation apparatus 91 of the comparative example. The phase difference generation part 61 includes first to third transparent elements 610. A plurality of light fluxes emitted from the first to third element lenses 620 respectively pass through the different transparent elements 610, i.e., the first to third transparent elements 610. The first transparent element 610 and the second transparent element 610 have different optical path lengths and produce a phase difference between light fluxes respectively passing through the first and second transparent elements. In the light irradiation apparatus 31*a*, interference between the light that has passed through the first element lens 620 (and the first transparent element 610) and the light that has passed through the second element lens 620 produces bright interference fringes, i.e., peaks in light intensity, at a plurality of positions P12 different from the positions P0 on the irradiation plane 320. The second transparent element 610 and the third transparent element 610 also have different optical path lengths and produce a phase difference between light fluxes respectively passing through the second and third transparent elements. Thus, interference between the light that has passed through the second element lens 620 and the light that has passed through the third element lens 620 produces peaks in light intensity at a plurality of positions P23 on the irradiation plane 320 different from the positions P0 and P12. In the distribution of light intensities on the irradiation plane 320, relatively small peaks are dispersed in the X direction as indicated by a solid line L2 in FIG. 5.

In actuality, the optical path lengths of the first to third transparent elements 610 of the phase difference generation part 61 are determined such that the positions P12 of peaks in light intensity on the irradiation plane 320 that result from the interference between the light fluxes that have passed through the first and second element lenses 620, are different from the positions P23 of peaks in light intensity on the irradiation plane 320 that result from the interference between the light fluxes that have passed through the second and third element lenses 620. As described above, the phase difference generation part 61 produces a phase difference in the light passing through the first to third transparent elements 610 so that shifts occur between the peak positions P12 in light intensity that correspond to the first and second element lenses 620 and the peak positions P23 in light intensity that correspond to the second and third element lenses 620.

In the light irradiation apparatus 31 illustrated in FIG. 3, similarly to the light irradiation apparatus 31*a* in FIG. 6, three transparent elements 610 that produce shifts in peak position are assigned to every combination of three element lenses 620 that are arrayed sequentially in the array direction among the plurality of element lenses 620 included in the division lens part 62. To be more specific, three element lenses 620 included in each combination (hereinafter, the three element lenses 620 are referred to as "target element lenses 620") include two target element lens pairs where each pair of adjacent target element lenses 620 is regarded as a target element lens pair. Then, the optical path lengths of three transparent elements 610 that correspond respectively to the three target element lenses 620 are determined such that the positions of peaks in light intensity on the irradiation plane 320 that result from interference between the light fluxes that have passed through one of the target element lens pairs are different from the positions of peaks in light intensity on the irradiation plane 320 that result from interference between the light fluxes that have passed through the other target element lens pair.

Although two transparent elements 610 on which the light fluxes that have passed through each target element lens pair are incident have different optical path lengths as previously described, a difference in optical path length between the two transparent elements 610 is less than the coherence length of the laser light. Here, the difference in optical path length between the two transparent elements 610 can be expressed as $((n-1) \cdot t)$, where the refractive index of air is 1, n is the refractive index of the transparent elements 610, and t is the difference in Z-direction thickness between the two transparent elements 610. In the present embodiment, the difference in optical path length between the two transparent elements 610 is less than or equal to the wavelength (e.g., 808 nm) of the laser light. In this case, the phase difference generation part 61 in which all transparent elements 610 are made of the same material is such that a difference in thickness between the two transparent elements 610 is, for example, greater than or equal to 100 nm and less than or equal to 2000 nm. Note that the difference in optical path length that takes into account a difference in optical path length from the light source part 4 to the irradiation plane 320 between the light fluxes that have passed respectively through the two transparent elements 610, i.e., a difference in optical path length that takes into account a difference in optical path between the light fluxes that have passed through the two transparent elements 610, is also less than the coherence length of the laser light.

The thicknesses of the plurality of transparent elements 610 of the phase difference generation part 61 in FIG. 3 are determined using, for example, the following technique. First, one combination of thicknesses of a plurality of transparent elements 610 is prepared. For example, the thickness of each transparent element 610 is set to produce a difference $(N/M)\lambda$ in optical path length, where $\lambda$ is the wavelength of the laser light emitted from the light source part 4, as compared to the case where there are no transparent elements 610 (i.e., thicknesses is zero). Here, M is an integer that is greater than or equal to the number of element lenses 620 of the division lens part 62, and N is an integer that is less than or equal to M and greater than or equal to zero. It goes without saying that the thickness of each transparent element 610 is not limited to a thickness that produces a difference $(N/M)\lambda$ in optical path length. Next, the distribution of light intensities on the irradiation plane 320 when the light irradiation apparatus uses a plurality of transparent elements 610 having this combination of thicknesses is acquired through simulations, and an evaluation value that indicates the variation in the distribution of light intensities (here, the evaluation value decreases with decreasing variation) is acquired. Then, evaluation values are acquired while changing the combination of thicknesses a plurality of times, and a combination of thicknesses for which the evaluation value is less than or equal to a predetermined target value is employed as the thicknesses of the plurality of transparent elements 610 in the phase difference generation part 61.

It can be said that with a combination of thicknesses for which the evaluation value is less than or equal to the target value, any combination of three element lenses 620 that are arrayed sequentially in the array direction among the plurality of element lenses 620 always produces shifts in peak positions. In other words, the three target element lenses 620 included in this combination are such that the positions of peaks in light intensity on the irradiation plane 320 that result from interference between the light fluxes that have passed through one of the target element lens pairs are different from the positions of peaks in light intensity on the irradiation plane 320 that result from interference between the light fluxes that have passed through the other target element lens pair. By setting the target value to a small value, a combination of thicknesses that can produce shifts in peak positions can be obtained for each of a plurality of combinations (more preferably, all combinations) of three element lenses 620 that are arrayed sequentially in the array direction.

In one method of manufacturing the phase difference generation part 61, a plate-like member (e.g., a glass plate) made of a predetermined light conductive material is first prepared. Next, a mask is formed on the surface of the plate-like member, excluding some regions, and an etching process is performed on the surface of the plate-like member. The mask is removed after completion of the etching process. By repeating the above processes (the formation of the mask, the etching process, and the removal of the mask), the phase difference generation part 61 is manufactured in which the portion corresponding to each transparent element 610 has a thickness determined by the above processes.

Figure 7:
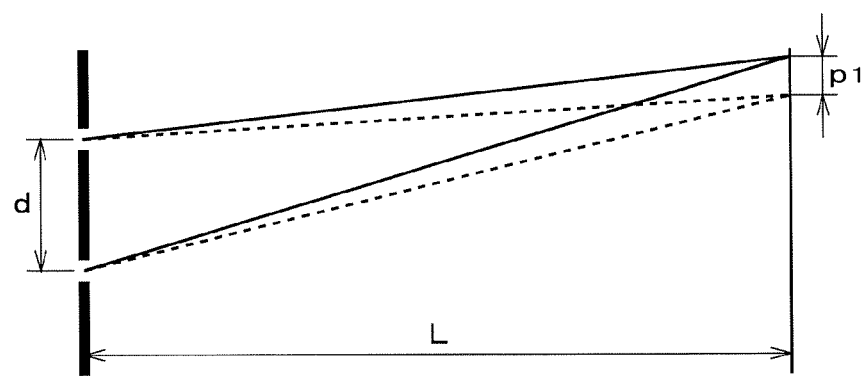
FIG. 7 is a diagram for describing interference fringes produced by slits.

Here, an interval $p_1$ between interference fringes produced by two slits can be expressed by Expression 1, where $\lambda$ is the wavelength of the laser light, d is the interval between the slits, and L is the distance from the slits to an image plane, as illustrated in FIG. 7.

$$p_1 = L\lambda/d \qquad \text{Expression 1}$$

In the light irradiation apparatus 31, the interval d between the slits corresponds to the pitch in the array direction of element lenses 620, and the distance L from the slits to the image plane corresponds to the focal length of the condensing lens 631. Moreover, the light irradiation apparatus 31 with the division lens part 62 including three or more element lenses 620 produces very small peaks so as to equally divide the above interval $p_1$, at which a large peak appears, by the number of element lenses 620. Thus, with the light irradiation apparatus that omits the phase difference generation part 61, a minimum interval $p_2$ at which a peak (including a very small peak) in light intensity appears can be expressed by Expression 2, where m is the number of element lenses 620 included in the division lens part 62.

$$p_2 = L\lambda/(md) \qquad \text{Expression 2}$$

In the light irradiation apparatus 31 including the phase difference generation part 61, the amount of shift (distance) in peak position of light intensity on the irradiation plane 320 between the two target element lens pairs within the three target element lenses 620 is preferably greater than the above minimum interval $p_2$. The above amount of shift in peak position can be obtained through simulation or experiments. Note that the number m of element lenses 620 included in the light irradiation apparatus 31 in FIG. 3 is five, and the number m of element lenses 620 included in the light irradiation apparatus 31a in FIG. 6 is three.

Figure 8:
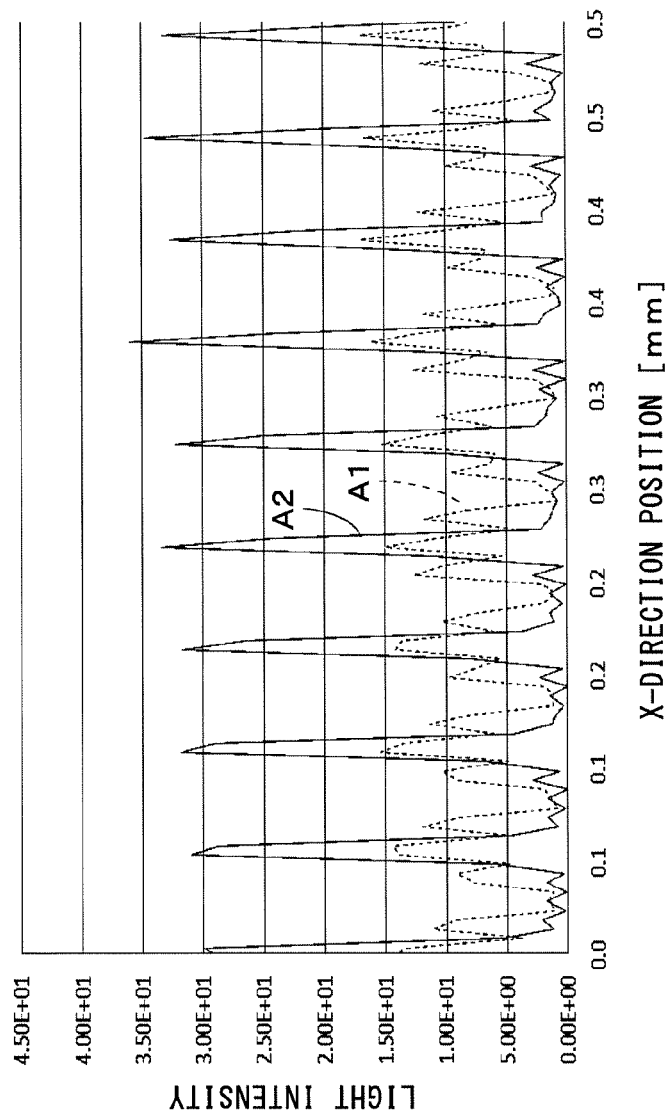
FIG. 8 illustrates a distribution of light intensities.

FIG. 8 illustrates the distribution of light intensities obtained through simulation. In FIG. 8, a broken line A1 indicates the distribution of light intensities on the irradiation plane 320 for the light irradiation apparatus 31 in FIG. 3, and a solid line A2 indicates the distribution of light intensities on the irradiation plane 320 for the light irradiation apparatus 31 from which the phase difference generation part 61 is omitted. The broken line A1 in FIG. 8 indicates that each large peak in light intensity, indicated by the solid line A2, is divided into three relatively small peaks. This shows that the light irradiation apparatus 31 can suppress variations (speckle patterns) in light intensity caused by interference between the light fluxes on the irradiation plane 320, as compared to the case where the phase difference generation part 61 is omitted. The light irradiation apparatus 31 increases the minimum value and reduces the difference between the minimum and maximum values in the distribution of light intensities, as compared to the case where the phase difference generation part 61 is omitted. Accordingly, the drawing apparatus 1 including the light irradiation apparatus 31 can draw a pattern with high precision.

Incidentally, it is also conceivable for the light irradiation apparatus to suppress the appearance of interference fringes on the irradiation plane 320 by, in each combination of two transparent elements among a plurality of transparent elements, setting a difference in optical path length between the two transparent elements to be greater than or equal to the coherence length of the laser light. This, however, requires a considerable increase in the Z-direction length (thickness) of the transparent elements, thus undesirably increasing the size of the light irradiation apparatus.

In the light irradiation apparatus 31, on the other hand, a difference in optical path length between two transparent elements 610 that correspond to each target element lens pair is less than the coherence length of the laser light emitted from the light source part 4. Thus, it is possible to reduce the thickness of the phase difference generation part 61 (transparent elements 610) and to suppress an increase in the size of the light irradiation apparatus 31. The difference in optical path length between the two transparent elements 610 is preferably less than or equal to the wavelength of the laser light. In this case, it is possible to greatly reduce the thickness of the phase difference generation part 61 and to further suppress an increase in the size of the light irradiation apparatus 31. The light irradiation apparatus 31 in which the division lens part 62 and the phase difference generation part 61 are adjacent to each other allows the light fluxes that have passed through the element lenses 620 to easily enter the corresponding transparent elements 610, respectively.

Figure 9:
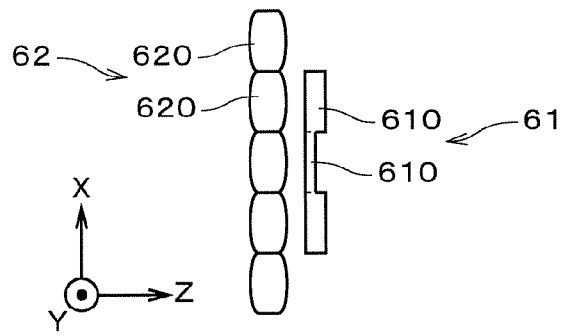
FIG. 9 illustrates another example of the phase difference generation part.
Figure 10:
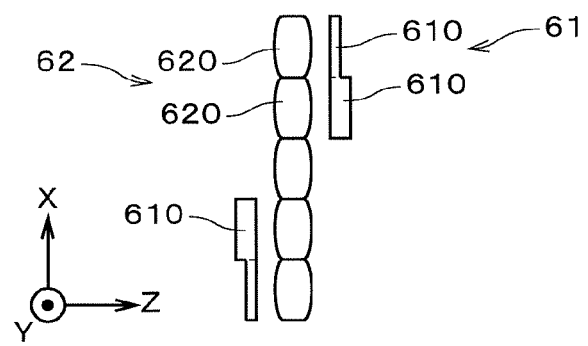
FIG. 10 illustrates another example of the phase difference generation part.
Figure 11:
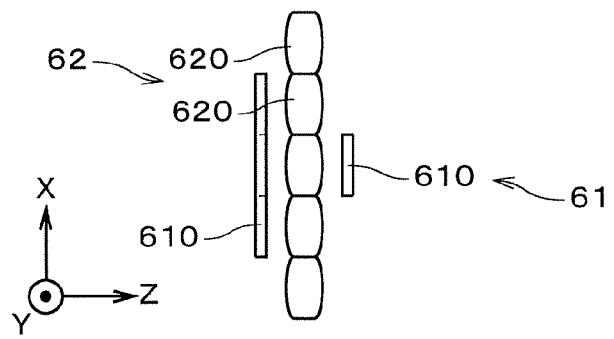
FIG. 11 illustrates another example of the phase difference generation part.

FIGS. 9 through 11 illustrate other examples of the phase difference generation part. In the phase difference generation parts 61 in FIGS. 9 through 11, similarly to the light irradiation apparatus 31a in FIG. 6, three transparent elements 610 that produce shifts in peak position are assigned to every combination of three element lenses 620 that are arrayed sequentially in the array direction. Although there are no transparent elements 610 that correspond to the element lens 620 disposed furthest to the +X side and the element lens 620 disposed furthest to the −X side in FIGS. 9 and 11 and there is no transparent element 610 that corresponds to the element lens 620 disposed in the center in FIG. 10, it can be substantially regarded that a single transparent element having a thickness of zero is assigned to each of these element lenses 620.

In the example in FIG. 10, some transparent elements 610 of the phase difference generation part 61 are provided on the +Z side (light condensing part 63 side) of the division lens part 62, and the remaining transparent elements 610 are provided on the −Z side (light source part 4 side) of the division lens part 62. In the example in FIG. 11, part of a transparent element 610 is provided on the +Z side of the element lens 620 in the center, and the remaining part of the transparent element 610 is provided on the −Z side thereof. In other words, a single transparent element 610 corresponding to the element lens 620 in the center is constituted by the portion provided on the +Z side of the element lens 620 in the center and the portion provided on the −Z side thereof. As described above, the phase difference generation part 61 includes a plurality of transparent elements 610, on which the light fluxes that have passed through the element lenses 620 or the light fluxes that travel toward the element lenses 620 are respectively incident. In the examples in FIGS. 9 to 11, the division lens part 62 and the phase difference generation part 61 are adjacent to each other so that the light that has passed through each element lens 620 can easily enter the corresponding transparent element 610, or the light that has passed through each transparent element 610 can easily enter the corresponding element lens 620.

The above-described light irradiation apparatuses 31 and 31a can be modified in various ways.

Figure 12:
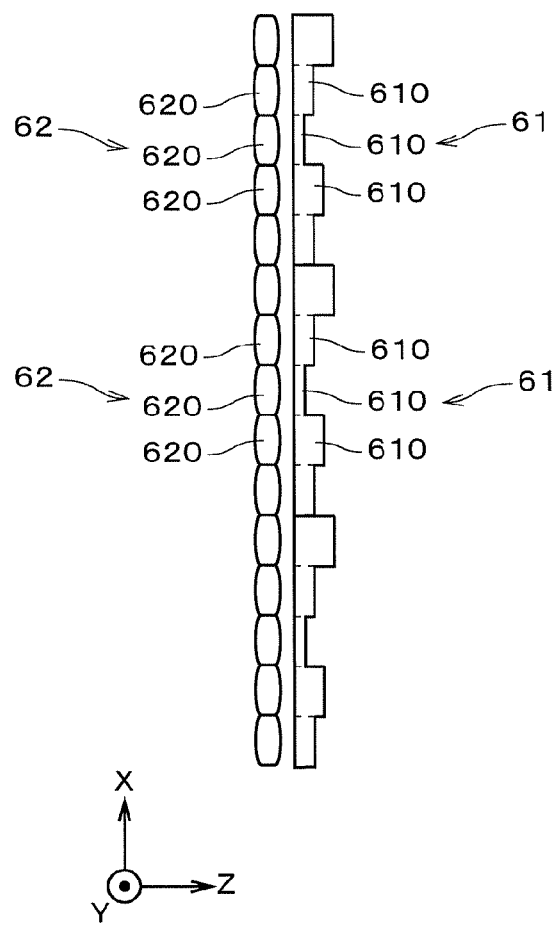
FIG. 12 illustrates another example of the phase difference generation part.

When the light irradiation apparatus includes a large number of element lenses 620, a plurality of phase difference generation parts 61 of the same irregular shape may be arrayed in the array direction as illustrated in FIG. 12. In the example in FIG. 12, the plurality of phase difference generation parts 61 of the same shape are arrayed sequentially in the array direction, each phase difference generation part 61 consisting of five transparent elements 610 that are arrayed sequentially in the array direction. In this case, it can be regarded that a plurality of division lens parts 62 are arrayed sequentially in the array direction, each division lens part 62 consisting of a plurality of element lenses 620 that correspond respectively to the plurality of transparent elements 610 included in each phase difference generation part 61. In this way, use of a plurality of phase difference generation parts 61 in which the plurality of transparent elements 610 arrayed sequentially in the array direction have the same change in optical path length can reduce the manufacturing cost of the light irradiation apparatus including a large number of element lenses 620. The number of transparent elements 610 included in each phase difference generation part 61 is, for example, 5 or more and less than or equal to 15.

Figure 13:
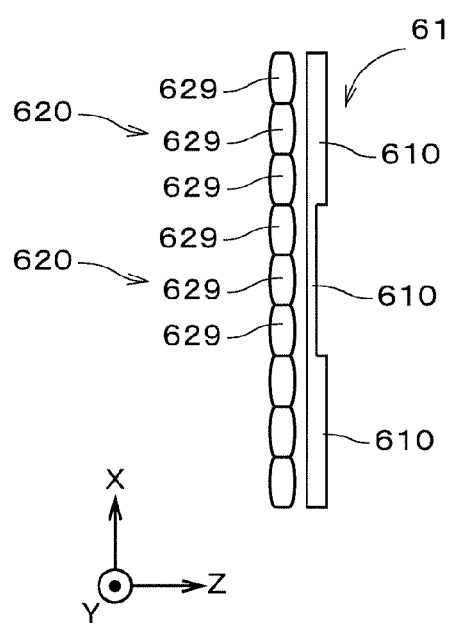
FIG. 13 illustrates another example of the phase difference generation part.

Depending on the design of the light irradiation apparatus, a combination of a plurality of lenses 629 may be regarded as a single element lens 620 as illustrated in FIG. 13. In this case as well, the phase difference generation part 61 includes a plurality of transparent elements 610, on each of which the light that has passed through a corresponding one of a plurality of element lenses 620 (or the light that travels toward each of the element lenses 620) is incident.

From the viewpoint of suppressing variations in light intensity caused by interference between the light fluxes on the irradiation plane 320, a configuration may be adopted in which only one combination of three element lenses 620 that are arrayed sequentially in the array direction among a plurality of element lenses 620 included in the division lens part 62 produces shifts in peak position of light intensity between the two target element lens pairs. However, in order to further suppress variations in light intensity on the irradiation plane 320, it is preferable to assign three transparent elements 610 that produce a shift in peak position to three target element lenses 620 that are included in each of a plurality of combinations of three element lenses 620 arrayed sequentially in the array direction. From the viewpoint of producing a shift in peak position of light intensity between two target element lens pairs, it is sufficient for two transparent elements 610 corresponding to at least one of the target element lens pairs to have different optical path lengths.

Alternatively, another optical element may be provided between the division lens part 62 and the phase difference generation part 61 as long as the light that has passed through each of the element lenses 620 or the light that travels toward each of the element lenses 620 can enter a corresponding one of the transparent elements 610. Such a configuration can be achieved by, for example, providing a lens that constitutes a double telecentric optical system between the division lens part 62 and the phase difference generation part 61. The element lenses 620 do not necessarily have to be cylindrical lenses, and may be lenses that have power in the X and Y directions. Moreover, a plurality of element lenses 620 of the division lens part 62 may be arrayed in two directions perpendicular to the optical axis J1 (a two-dimensional array). In this case, it is preferable for a plurality of transparent elements 610 to be arrayed in two dimensions so that the light fluxes that have passed through the element lenses 620 or the light fluxes that travel toward the element lenses 620 respectively enter the transparent elements 610.

The phase difference generation part 61 may cause the optical path lengths of two transparent elements 610 that correspond to each target element lens pair to be different from each other by vapor deposition of a predetermined material on a plurality of regions of a plate-like light conductive member that correspond respectively to a plurality of transparent elements 610, or by doping the member with a predetermined material. It is also possible to make the plurality of transparent elements 610 with different materials having a fixed thickness. Moreover, the transparent elements 610 may be formed directly on the surfaces (the first lens surfaces 621 or the second lens surfaces 622) of the element lenses 620.

In the above-described embodiment in which the light emitted from the plurality of light emitting points of the light source part 4 is divided in the array direction and light fluxes are superimposed on one another on the irradiation plane 320, the light source part 4 having a plurality of light emitting points is used to acquire linear illumination light having a uniform distribution of intensities. Alternatively, it goes without saying that the light source part 4 may have only one light emitting point.

On the path of the laser light in the above-described light irradiation apparatuses 31 and 31a, the light condensing part 63 disposed closer to the irradiation plane 320 than the division lens part 62 and the phase difference generation part 61 are may be achieved with various configurations as long as the irradiation regions 50 of the light from the plurality of element lenses 620 can be superimposed on one another on the irradiation plane 320.

In the drawing apparatus 1, the spatial light modulator 32 disposed on the irradiation plane 320 of the light irradiation apparatus 31 or 31a may be a device other than a diffraction grating type light modulator. For example, a spatial light modulator using a group of minute mirrors may be used. In this case, irradiation regions having a relatively large Y-direction width may be formed on the irradiation plane 320 by the light irradiation apparatuses 31 and 31a.

The drawing apparatus 1 may be an apparatus for drawing a pattern on a substrate placed on a stage as an object to be drawn. In this case, a movement mechanism for moving an irradiation position to be irradiated with light on the substrate is achieved by a mechanism for moving the stage relative to an optical head or a mechanism for moving the optical head relative to the stage.

An object on which the drawing apparatus 1 draws a pattern may be other than the recording medium 9 or substrates. The light irradiation apparatuses 31 and 31a may be used in apparatuses other than the drawing apparatus 1.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2014-161185 filed in the Japan Patent Office on Aug. 7, 2014, the entire disclosure of which is incorporated herein by reference.

REFERENCE SIGNS LIST

1 Drawing apparatus
2 Control part
4 Light source part
5 Irradiation optical system
9 Recording medium
31, 31a Light irradiation apparatus
32 Spatial light modulator
33 Projection optical system
50 Irradiation region
61 Phase difference generation part
62 Division lens part
63 Light condensing part
81, 82 Motor
320 Irradiation plane
610 Transparent element
620 Element lens
J1 Optical axis
P12, P23 Peak position

The invention claimed is:

1. A light irradiation apparatus comprising:
a light source part for emitting laser light toward a predetermined position; and
an irradiation optical system disposed at said predetermined position and for guiding said laser light emitted from said light source part to an irradiation plane along an optical axis,
wherein said irradiation optical system includes:
a division lens part including a plurality of element lenses arrayed in an array direction perpendicular to said optical axis, and for dividing incident light by said plurality of element lenses, wherein said plurality of element lenses include three target element lenses that are arrayed sequentially in said array direction among said plurality of element lenses, said three target element lenses include first and second pairs of target element lens, and an intermediate one of the three target element lenses is commonly shared by the first and second pairs;
a phase difference generation part including a plurality of transparent elements arrayed in said array direction and in which light fluxes that have passed through said plurality of element lenses or light fluxes that travel toward said plurality of element lenses respectively enter said plurality of transparent elements, wherein said plurality of transparent elements include three transparent elements that correspond respectively to said three target element lenses; and a light condensing part disposed closer to said irradiation plane than said division lens part and said phase difference generation part are, and for superimposing irradiation regions of light fluxes from said plurality of element lenses on each other on said irradiation plane, wherein optical path lengths of said three transparent elements are determined such that a peak position of light intensity on said irradiation plane resulting from interference between light fluxes that have passed through the first pair is different from a peak position of light intensity on said irradiation plane resulting from interference between light fluxes that have passed through the second pair, and a difference in optical path length between two transparent elements that correspond to each pair is less than a coherence length of said laser light.

2. The light irradiation apparatus according to claim 1, wherein any three element lenses that are arrayed sequentially in said array direction among said plurality of element lenses are said three target element lenses.

3. The light irradiation apparatus according to claim 1, wherein said division lens part and said phase difference generation part are adjacent to each other.

4. The light irradiation apparatus according to claim 1, wherein a difference in optical path length between said two transparent elements is less than or equal to a wavelength of said laser light.

5. The light irradiation apparatus according to claim 1, wherein a direction of incidence of said laser light is perpendicular to said array direction of said plurality of element lenses of said division lens part.

6. A drawing apparatus comprising:
the light irradiation apparatus according to claim 1;
a spatial light modulator disposed on said irradiation plane in said light irradiation apparatus;
a projection optical system for guiding spatially modulated light emitted from said spatial light modulator onto an object;
a movement mechanism for moving an irradiation position to be irradiated with said spatially modulated light on said object; and
a control part for controlling said spatial light modulator in synchronization with the movement of said irradiation position by said movement mechanism.

7. A phase difference generator provided in an irradiation optical system of a light irradiation apparatus that includes a light source part for emitting laser light toward a predetermined position and said irradiation optical system disposed at said predetermined position and for guiding said laser light emitted from said light source part to an irradiation plane along an optical axis, wherein
said irradiation optical system includes:
a division lens part including a plurality of element lenses arrayed in an array direction perpendicular to said optical axis, and for dividing incident light by said plurality of element lenses, wherein said plurality of element lenses include three target element lenses that are arrayed sequentially in said array direction among said plurality of element lenses, said three target element lenses include first and second pairs of target element lens, and an intermediate one of the three target element lenses is commonly shared by the first and second pairs; and
a light condensing part disposed between said division lens part and said irradiation plane and for superimposing irradiation regions of light fluxes from said plurality of element lenses on each other on said irradiation plane,
said phase difference generator comprises a plurality of transparent elements arrayed in one direction, wherein in said irradiation optical system, light fluxes that have passed through said plurality of element lenses or light fluxes that travel toward said plurality of element lenses respectively enter said plurality of transparent elements, and said plurality of transparent elements include three transparent elements that correspond respectively to said three target element lenses,
wherein optical path lengths of said three transparent elements are determined such that a peak position of light intensity on said irradiation plane resulting from interference between light fluxes that have passed through the first pair is different from a peak position of light intensity on said irradiation plane resulting from interference between light fluxes that have passed through the second pair, and
a difference in optical path length between two transparent elements that correspond to each pair is less than a coherence length of said laser light.

8. The phase difference generator according to claim 7, wherein any three element lenses that are arrayed sequentially in said array direction among said plurality of element lenses are said three target element lenses.

9. The phase difference generator according to claim 7, wherein the phase difference generator is disposed adjacent to said division lens part in said light irradiation apparatus.

10. The phase difference generator according to claim 7, wherein a difference in optical path length between said two transparent elements is less than or equal to a wavelength of said laser light.

11. The phase difference generator according to claim 7, wherein a direction of incidence of said laser light is perpendicular to said array direction of said plurality of element lenses of said division lens part.

* * * * *